United States Patent [19]

Tsukajima et al.

[11] Patent Number: 5,895,916
[45] Date of Patent: Apr. 20, 1999

[54] METHOD AND APPARATUS FOR ADJUSTING ELECTRON BEAM APPARATUS

[75] Inventors: Junichi Tsukajima; Toshinori Hayashi; Toru Enokijima, all of Kanagawa-ken, Japan

[73] Assignees: Research Development Corporation of Japan, Kawaguchi; Tosoh Corporation, Shinnanyo, both of Japan

[21] Appl. No.: 08/569,264

[22] PCT Filed: Jun. 22, 1994

[86] PCT No.: PCT/JP94/00994

§ 371 Date: Dec. 22, 1995

§ 102(e) Date: Dec. 22, 1995

[87] PCT Pub. No.: WO95/00835

PCT Pub. Date: Jan. 5, 1995

[30] Foreign Application Priority Data

Jun. 23, 1993 [JP] Japan ............... 5/152187

[51] Int. Cl.⁶ .......................... H01J 47/00
[52] U.S. Cl. ................... 250/305; 250/310
[58] Field of Search .................... 250/305, 310

[56] References Cited

U.S. PATENT DOCUMENTS

| | | | |
|---|---|---|---|
| 3,812,288 | 5/1974 | Walsh et al. | 250/310 |
| 3,813,545 | 5/1974 | Barnhart et al. | 250/310 |
| 4,988,872 | 1/1991 | Nagatsuka et al. | 250/310 |
| 5,118,941 | 6/1992 | Larson | 250/310 |
| 5,192,866 | 3/1993 | Komi | 250/310 |
| 5,315,113 | 5/1994 | Larson et al. | 250/305 |
| 5,444,242 | 8/1995 | Larson et al. | 250/305 |

FOREIGN PATENT DOCUMENTS 2 208 432  3/1989  United Kingdom.

*Primary Examiner*—Bruce Anderson
*Attorney, Agent, or Firm*—Oblon, Spivak, McClelland, Maier & Neustadt, P.C.

[57] ABSTRACT

In an electron beam apparatus having an energy analyzer for analyzing the electron beam energy, matching may be performed accurately and easily of the position to be irradiated by an electron beam and the position for which an energy analysis is performed. The electron beam apparatus includes: an electron-optical lens column 401 provided as capable of scanning an electron beam ED in an XY direction and capable of deflecting it in the XY direction; an energy analyzer 408; and image display means 416 for displaying an SEM image of a predetermined range on a sample 407 by an electron beam scanning. An energy analysis area 504 for which electrons are efficiently taken into the energy analyzer is displayed as an image upon the SEM image by analyzing an output information obtained at the energy analyzer 408 at the time of an electron beam scanning. An analyzing electron-beam irradiation position 502 to be irradiated by an electron beam on the trajectory emitted from the electron-optical lens column 401 at the time corresponding to the non-scanning state of the electron beam is displayed as an image upon the SEM image. The trajectory of the electron beam to be irradiated onto the sample is deflected so that the energy analysis area 504 and the analyzing electron-beam irradiation position 502 are matched on the SEM image.

7 Claims, 5 Drawing Sheets

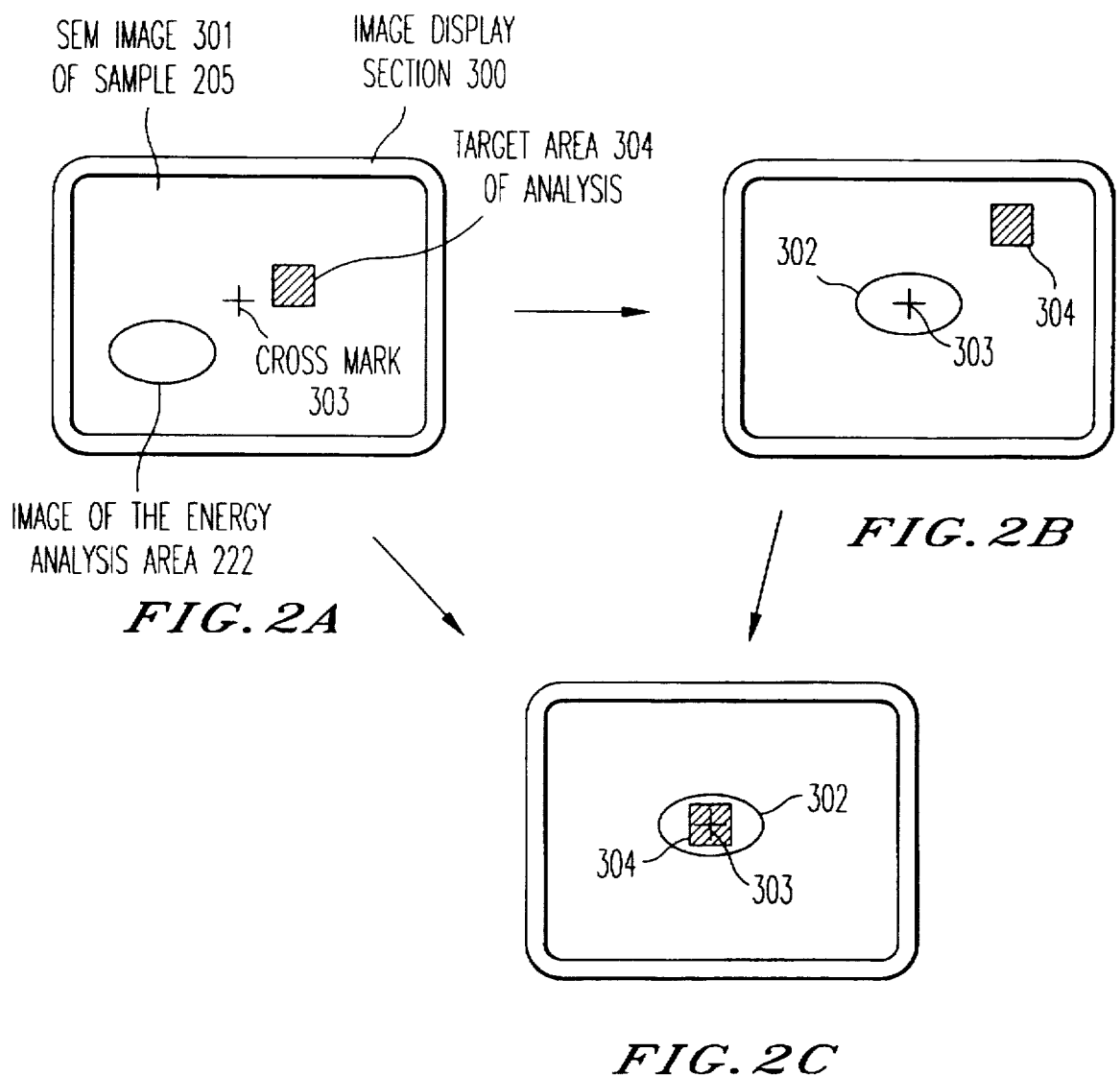

METHOD AND APPARATUS FOR ADJUSTING ELECTRON BEAM APPARATUS

BACKGROUND OF THE INVENTION

1. Field of the Invention

The present invention relates electron beam apparatus having an energy analyzer or energy analyzers for analyzing electron beam energy such as an electron beam energy loss spectrum measuring apparatus or an Auger electron spectrum measuring apparatus.

2. Description of the Related Art

In recent years, the importance of analyzing composition, state of electrons, structure, etc., of a fine region on a sample surface has been increased in developments and researches of the electronic materials such as semiconductors or newly developed materials such as fine ceramics. For this reason, apparatus are used for analyzing a fine region of the order of microns by irradiating a narrow focused electron beam onto the sample.

An example of this type of electron beam apparatus is shown in FIG. 5. In this figure, numeral 1 denotes an electron gun and numeral 2 denotes an electron lens, both being accommodated in an electron-optical lens column 3. The other components includes: an electron beam (EB) 4; a sample 5; an energy analyzer 6; a focusing lens 7; sector electrodes 8; an electron beam detector 9; a signal amplifier 10; a computer 11; an input device 12; a display unit 13; and a storage unit 14.

In such an apparatus, the electron beam 4 emitted from the electron gun 1 is irradiated onto the sample 5 as it is focused by the electron lens 2. As a result, reflected electrons or electrons generated due to the electron beam irradiation are emitted from the sample 5, the emitted electrons being guided to the energy analyzer 6. At the energy analyzer 6, the energy axis is moved in accordance with a command from the computer 11 to perform energy analysis of the guided electrons. The result of energy analysis detected at the electron beam detector or detectors 9 is/are for example displayed on the electron display unit 13 through a predetermined signal processing. It should be noted that, in such an apparatus, the focusing lens 7 is provided at the energy analyzer 6 so that electrons from a region of several hundred μm to 1 mm of the sample may be efficiently guided into the energy analyzer 6 in order to analyze a fine region of the sample.

Here, a problem which must be considered in performing analysis of a fine region of the sample by an irradiation of such electron beam is that matching of three regions assumed on the sample surface is desirable to perform a suitable analysis, the three regions being an analytical target area, an electron beam irradiation position at the time of analysis and an energy analysis area. In other words, it is necessary for a suitable analyzing operation to accurately irradiate the electron beam onto an intended position of the analysis and to efficiently take in by the energy analyzer the electrons emitted from the sample due to the electron beam irradiation. Here, the analytical target area refers to a region on the sample surface which is considered as the object of analysis by the analyst; the analyzing electron beam irradiation position refers to the position on the sample surface onto which the electron beam emitting from the electron-optical lens column is irradiated when the electron beam apparatus is in its state for executing analysis; and the energy analysis area refers to the region where the electrons emitted from the sample are efficiently guided to the energy analyzer.

For this reason, in the conventional electron beam apparatus, the electron-optical lens column, energy analyzer, and vacuum vessel for forming an analytical chamber, etc., are manufactured highly accurately in their dimension to make smaller the errors in mechanically attaching for example the electron-optical lens column and the energy analyzer to the vacuum vessel. In addition, it is usually constructed so as to allow an adjustment of relative position or posture of the respective portions of the apparatus such as the electron gun, a stage for placing a sample and the energy analyzer. For example, means capable of a fine adjustment of the relative position is generally provided to enhance the degree of matching of the above described regions. Known fine adjustment means of this type include: adjustment means for, while observing an electron beam detection signal from the energy analyzer in a state where the electron beam apparatus is operated, adjusting the positions, for example, of the electron-optical lens column, energy analyzer and sample or adjusting the analyzing electron beam irradiation position by an electron beam alignment device provided on the electron-optical lens column such that the detection signal is brought to its maximum in order to match the analyzing electron beam irradiation position and the energy analysis area.

In the conventional apparatus as described above, however, the two regions, i.e., the analyzing electron beam irradiation position and the energy analysis area cannot be detected with a clear distinction from each other. In actual operation, a manual adjustment by the operator is required, resulting in an intricate and time consuming adjustment.

Further, in the case where an extremely limited region is to be measured, matching is desired not only between the analyzing electron-beam irradiation position and the energy analysis area but also of the three regions also including the analytical target area. A suitable method for this has not been provided.

As described above, fine adjustment means for matching an analyzing electron beam irradiation position and an energy analysis area which is conventionally employed in an electron beam apparatus having an energy analyzer or energy analyzers requires an intricate and time consuming adjustment as it is incapable of providing a view with a clear distinction between the two regions. Further, a suitable method or means has not been provided to match the three regions, i.e., analytical target area, analyzing electron beam irradiation position and energy analysis area. In view of these current state of facts, the present inventor undertook an intensive research and has achieved the present invention.

SUMMARY OF THE INVENTION

It is an object of the present invention to provide method and apparatus capable of matching accurately and in a short time period the two regions of the analyzing electron beam irradiation position and energy analysis area on a sample surface or the three regions of an analytical target area, analyzing electron beam irradiation position and energy analysis area on a sample surface in an electron beam apparatus having an energy analyzer or energy analyzers.

To achieve the above object, the present invention comprises: upon a SEM image (scanning electron microscope image) of a sample surface obtained by scanning an electron beam over the sample surface, displaying an image of the energy analysis area as a partial image changed in luminance or color of a predetermined area of the SEM image or as a figure encircling the relevant area based on an output from the energy analyzer obtained when scanning an electron beam on the sample surface; displaying on the SEM image, as a symbol or figure such as a cross mark, an analyzing electron beam irradiation position which is the position where the sample is irradiated by the electron beam when the electron beam apparatus is in its state of executing an analysis; observing the position and shape with respect to these regions; and, based on the result of such observation, adjusting the irradiation position of the electron beam and position of the sample; thereby matching is possible accurately and in a short time period of the two regions, i.e., the analyzing electron beam irradiation position and energy analysis area or of the three regions, i.e., the analytical target area, analyzing electron beam irradiation position and energy analysis area.

In order to more specifically achieve such features, the present invention has been made as claimed in each claim of the claims.

One of the features of the present invention is such that—in an electron beam apparatus including: an electron-optical lens column for irradiating a sample provided as capable of scanning an electron beam in a predetermined XY direction with limiting the emitting trajectory of the electron beam within a predetermined range; and an energy analyzer for taking in and analyzing the electrons emitted from the sample onto which the electron beam is irradiated; and image display means for displaying as a picture image an SEM image of a predetermined range on the sample including an analytical target area based on the electron beam scanning by the above described electron-optical lens column—displaying as an image upon the SEM image an energy analysis area where electrons are taken into the energy analyzer in a highly efficient manner by analyzing an output information obtained at the energy analyzer at the time of electron beam scanning and at the same time displaying as an image upon the SEM image an analyzing electron beam irradiation position to be irradiated by the electron beam on the trajectory emitted from the electron-optical lens column in the condition corresponding to the non-scanning state of the electron beam; and moving the trajectory of the electron beam to be irradiated on the sample such that the energy analysis area and the analyzing electron beam irradiation position are matched to each other on the SEM image. Further, it is also possible that an analytical target area optionally specified on the sample for performing an analysis is displayed as an image on the SEM image so that, by moving the sample, the analytical target area is matched to the energy analysis area and/or the analyzing electron beam irradiation position.

In the above construction, a method of mechanically moving the energy analyzer and/or the electron-optical lens column may be employed as the method for moving the trajectory of the electron beam to be irradiated onto the sample so that the energy analysis area and the analyzing electron beam irradiation position match each other on the SEM image. However, it is preferable to provide a deflecting device having a function capable of deflecting the electron beam emitted from the electron-optical lens column so that the analyzing electron beam irradiation position is moved by a deflection of the emitting electron beam by means of the deflecting device.

In the above construction, examples of the deflecting device in the electron-optical lens column include one capable of deflecting the emitting trajectory of the electron beam for irradiating the sample in an XY direction by an application of an electrical signal consisting of a DC component to the deflecting device and also capable of scanning in the XY direction of the electron beam within a predetermined range by an application of an electrical signal consisting of a DC component and an AC component.

Further, in the case of a deflecting device to which an electrical signal (voltage or current) consisting of DC component and AC component is applied, the electron beam on the trajectory emitted from the electron-optical lens column at the time corresponding to the non-scanning state of the electron beam for displaying the electron beam irradiated position on the SEM image corresponds to the electron beam emitted with only the DC component being applied.

The SEM image obtained from the above electron beam scanning is not specifically limited. In addition to one image processed by detecting a sample current, it may be an SEM image obtained from an image processing by detecting the reflected electrons from the sample or the secondary electrons generated from the sample.

According to the method of the present invention, prior to executing of an analysis, while scanning the electron beam in a relatively wide range on the sample surface including an analytical target area, energy analysis area and analyzing electron beam irradiation position, displayed on the image screen are: the energy analysis area based on detection information of the energy analyzer; the electron beam irradiation position at the time of an irradiating analysis where the electron beam is irradiated at the time corresponding to its non-scanning state which corresponds to the state of executing an analysis; and SEM image. By merely performing an operation for matching their positions on the screen by controlling the deflection of the deflecting device or, in addition, moving the sample, an intended matching of the positions of these regions and position may be readily achieved.

Further, an example of electron beam apparatus made according to the present invention for achieving the above method comprises: an electron-optical lens column having an electron gun, an electron lens electron lenses and an XY deflecting device provided as capable of deflecting the emitting trajectory of the electron beam for irradiating a sample in an XY direction and capable of scanning the electron beam in the same XY direction within a predetermined range; an energy analyzer for taking in the electrons emitted from the sample onto which the electron beam is irradiated; an image display unit for displaying an SEM image of a predetermined range on the sample obtained by scanning of the electron beam; a first image processing means for computing an energy analysis area where the electrons are efficiently taken into the energy analyzer based on an output information obtained from the energy analyzer at the time of scanning of the electron beam to display the area upon the SEM image in a superimposed manner; a second image processing means for displaying upon the SEM image an analyzing electron beam irradiation position to be irradiated by the electron beam on the trajectory emitted from the electron-optical lens column at the time corresponding to the non-scanning state of the electron beam; and position adjustment means for changing the relative position between the energy analysis area and the analyzing electron beam irradiation position, the position adjustment means being constructed to deflect the electron beam emitting trajectory of the deflecting device in the XY direction.

BRIEF DESCRIPTION OF THE DRAWINGS

FIGS. 2A–C illustrates images displayed on the display unit;

DESCRIPTION OF THE PREFERRED EMBODIMENT

The present invention will now be described in more detail by way of the drawings.

Figure 1A:
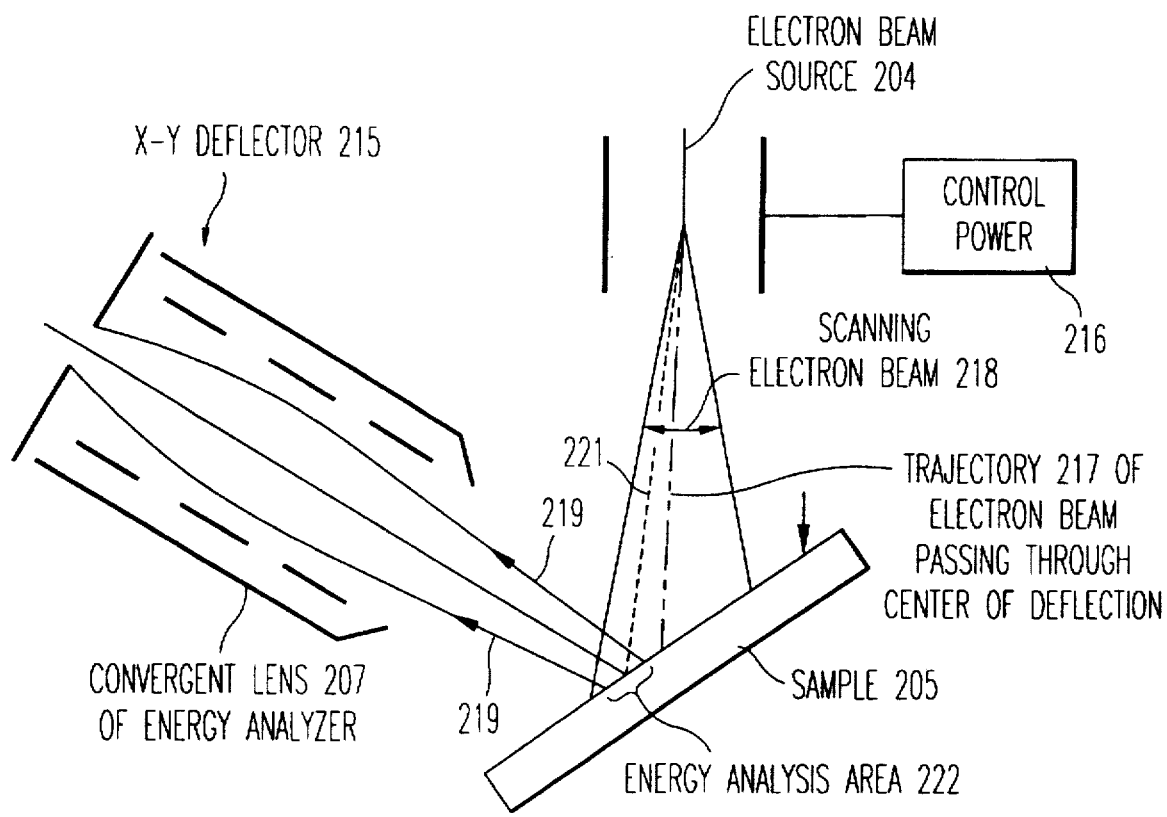
FIGS. 1A–B shows as a model the manner of an electron beam apparatus in the vicinity of a sample.
Figure 1B:
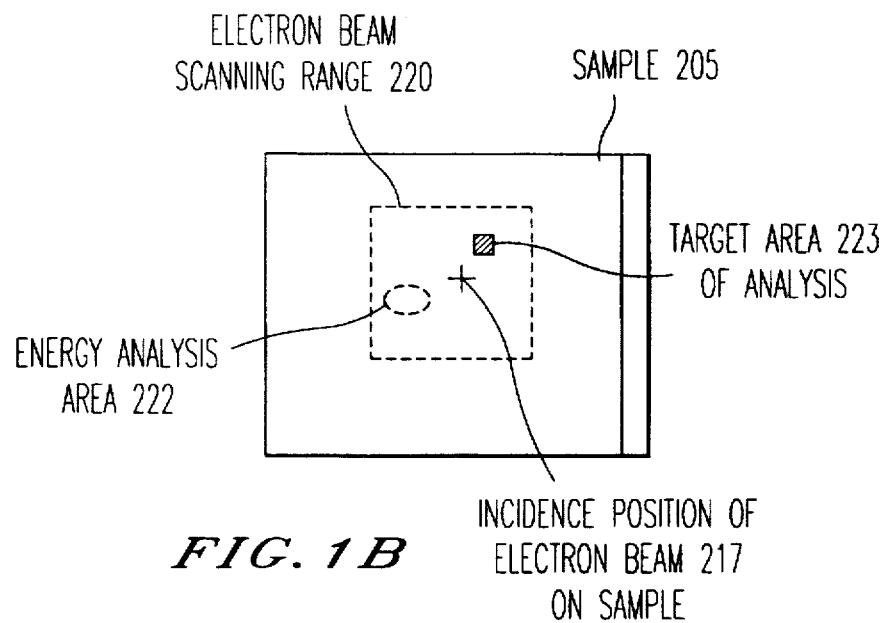

FIGS. 1 and 2 schematically illustrate an operation of the method of the present invention. FIG. 1 models the manner in the vicinity of a sample, where FIG. 1(a) schematically shows the construction of the apparatus as a whole and FIG. 1(b) shows the plane of the sample.

In these figures, denoted by the respective numerals are: an electron beam (ED) 204; a sample 205; a focusing lens 207 forming part of an energy analyzer; an XY-deflecting device 215 forming part of an electron-optical lens column; a control power supply 216 for the deflecting device 215; a trajectory 217 of electron beam passing through the center of deflection; a scanning electron beam 218; an electron beam 219 to be received by the focusing lens 207; an electron beam scanning range 220 on the sample 205 as indicated in FIG. 1(b); an energy analysis area 222 where the electrons emitted from the sample are efficiently taken into the energy analyzer; a trajectory 221 of the electron beam irradiating substantially the center portion of the energy analysis area 222; and an analytical target area 223 of which an analysis is intended by the operator. It should be noted that, while those denoted by numerals 220, 222, 223 shown in FIG. 1(b) do not actually appear on the sample surface, they are shown as imaginary lines to facilitate understanding.

Here, the above XY-deflecting device 215 for scanning the electron beam 204 is driven by a voltage (or current) obtained by adding a DC component and an AC component. It should be noted that the trajectory 217 of the electron beam passing through the center of deflection is the trajectory through which the electron beam 204 passes when the voltage or current applied on the XY-deflecting device 215 corresponds to only the DC component (including 0).

FIG. 2 illustrates an image display section 300 of the display unit including: an SEM image 301 of the sample 205; an image 302 of the energy analysis area 222; a cross mark 303 for indicating the position at which the electron beam trajectory 217 crosses the surface of the sample 205; and an analytical target area 304. Here, the position of the cross mark 303 will be the analyzing electron beam irradiation position and the cross mark 303 is always located at substantially the center of the image display section 300 even when varying the voltage (or current) of the DC component to be applied on the XY-deflecting device 215. While, in the present example, a cross mark is used as a pattern for indicating the analyzing electron-beam irradiation position on the screen of the display unit, it is of course possible to indicate the analyzing electron beam irradiation position by using various patterns other than the cross mark such as a circle, crossing two straight lines, etc.

A description will now be given with respect to a method for obtaining the energy analysis area image 302 in the present example.

In the present example, the apparatus is constructed so that luminance of images on the display device is modulated by an output from the electron beam detector of the energy analyzer. That is, by setting the voltage to be applied to the sector electrode or the like of the energy analyzer to a constant value, the electron beam 204 is scanned over the surface of the sample 205 under the same conditions as those of obtaining the SEM image 301. At this time, the luminance of image of the display unit is, for example, modulated by an output obtained from the electron beam detector of the energy analyzer. If, thereby, the irradiation position of the electron beam 204 on the surface of the sample 205 is within the energy analysis area 222, the energy analysis area 222 is brighter or dimmer than its background image as shown FIG. 2(a) in the image display section 300 as a result of an increase in the output from the electron beam detector of the energy analyzer. As a result, the energy analysis area image 302 is displayed in a manner superimposed upon the SEM image 301.

A description will be given below of a method for adjusting the electron beam 204 using thus displayed energy analysis area image 302 so that it irradiates substantially the center portion of the energy analysis area 222.

In this operation, only the DC component of the voltage (or current) for driving the XY-deflecting device 215 is first varied while viewing the SEM image 301. Thereby, the SEM image of the surface of the sample 205 and the energy analysis area image 302 is moved. By effecting this movement, the substantially center portion of the energy analysis area image 302 is matched to the cross mark 303. In the state shown in FIG. 2(b), the electron beam trajectory 217 substantially coincides the electron beam trajectory 221 as a result of the above operation, whereby the electron beam 204 irradiates substantially the center portion of the energy analysis area 222. In this manner, it is possible to match the analyzing electron beam irradiation position and the energy analysis area.

A description will now be given of a method for matching the three factors, i.e., the analyzing electron beam irradiation position, energy analysis area, and analytical target area. First, the analyzing electron beam irradiation position and the energy analysis area are matched to each other in the manner as described above. Then, while viewing the SEM image 301, the sample 205 is mechanically moved so that substantially the center portion of the analytical target area 304 matches the cross mark 303. As a result, as shown in FIG. 2(c), the electron beam 204 passing through the trajectory 221 becomes to irradiate substantially the center portion of the analytical target area 304, whereby the three factors of the analyzing electron beam irradiation position, energy analysis area and analytical target area are matched to each other.

As described above, the analyzing electron beam irradiation position and the energy analysis area may be matched by an easy operation and, furthermore, the analytical target area may also be matched thereto as required.

EXAMPLE (Apparatus)

Figure 3:
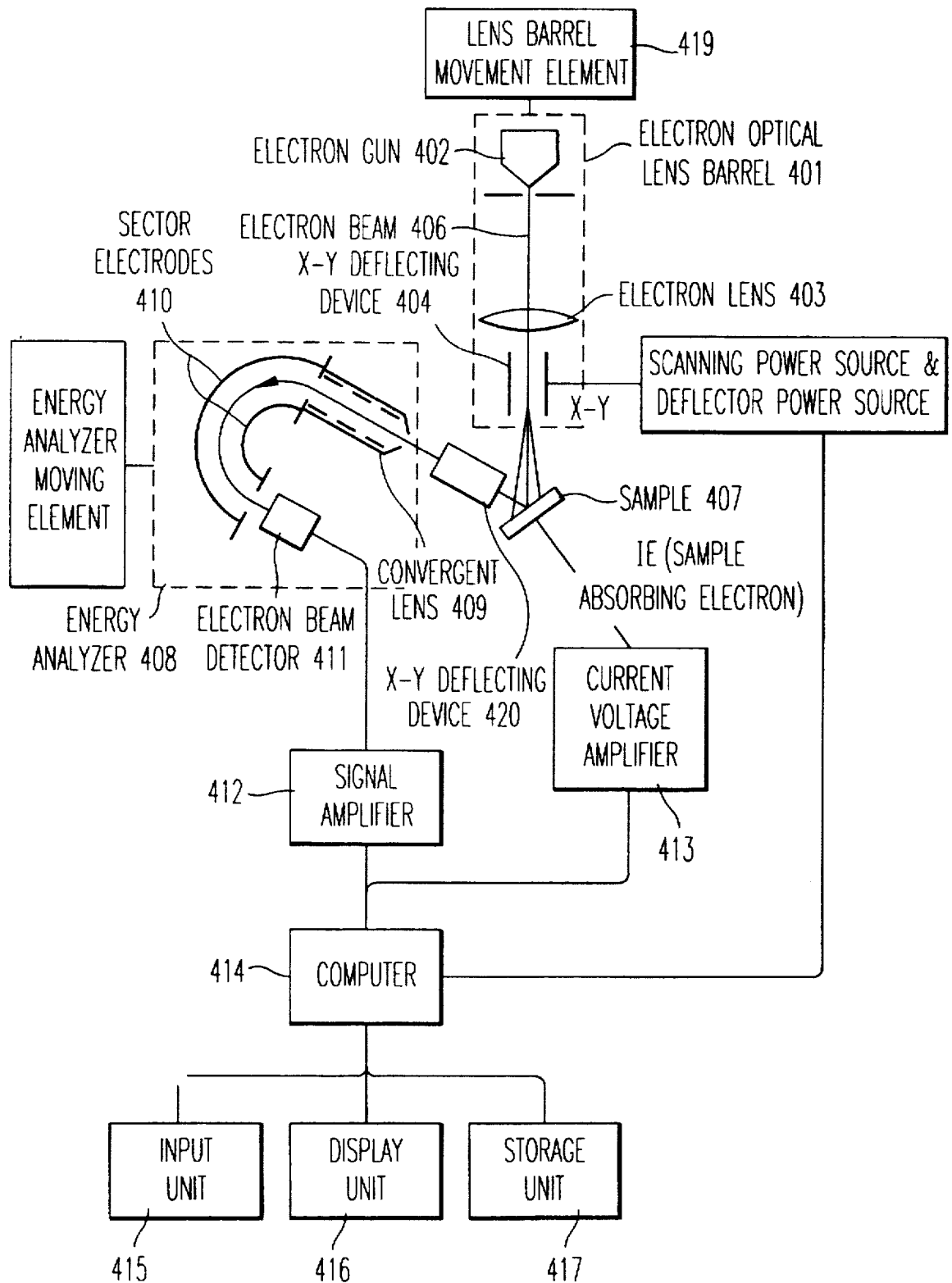
FIG. 3 schematically shows an example the construction of an electron beam apparatus of the present invention.

An example of the construction of the electron beam apparatus according to the present invention is schematically shown in FIG. 3.

Included in this figure are: an electron-optical lens column 401; an electron gun 402; an electron lens 403; an XY-deflecting device 404; a deflecting power supply 405 for the XY-deflecting device 404; an electron beam 406; a sample 407; an energy analyzer 408; a focusing lens 409; sector electrodes 410; an electron-beam detector 411; amplifiers 412, 413; a computer 414; an input device 415 for the computer 414; a display unit 416 connected to the computer 414; and a storage unit 417 of the computer 414. It should be noted that the sample 407 is mounted on an XY-stage 418 so that it may be moved in the XY direction, that 419 indicates a lens column moving element, that 420 indicates a modified deflection device position, and that 421 indicates an analyzer moving element.

The computer 414 controls the deflecting power supply 405 and energy analyzer 408 based on a command from the input device 415. Further, the computer 414 scans the electron beam 406 over the surface of the sample 407 through the deflecting power supply 405 and activates the display section of the display unit 416 by an output of the amplifier 413 which is read in synchronization with such scanning to thereby display an SEM image of the surface of the sample 407 on the display unit 416. In the present example, while the output of the amplifier 413 is the output obtained by detecting a sample current, it is not limited to this as described above.

Further, the computer 414 scans the electron beam over the surface of the sample 407 through the deflecting power supply 405 in accordance with a command from the input unit 415 and reads the value of a detection current of the electron beam detector 411 as an output from the amplifier 412 in synchronization with such scanning. These signals are image processed to display an energy analysis area image on the display unit 416. In particular, count at the electron beam detector 411, for example, is formed into pulses and it suffices to display each one pulse as a dot on the display unit 416. Since the manner by which the energy analysis area is read has been described above, its description will be omitted.

Figure 4A:
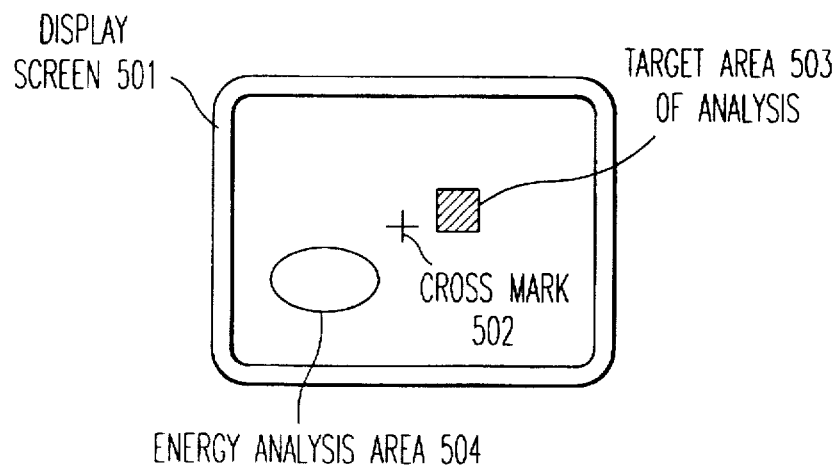
FIGS. 4A–C illustrates the display screen of the display unit of the same electron beam apparatus.

FIG. 4 shows the screen of the display unit 416. Numeral 501 denotes the display screen. A description will be given below starting from the state where an SEM image of the sample 407 is displayed on the display screen 501 as shown in FIG. 4(a).

Denoted by numeral 502 is a cross mark where the crossing point of the two straight lines is the position at which the electron beam passing through the center of deflection irradiates the surface of the sample 407, indicating the analyzing electron beam irradiation position. Here, the electron beam passing through the center of deflection refers to the electron beam which passes through the XY-deflecting device to irradiate the sample when corresponding to the case where the applied voltage (or current) to the XY-deflecting device 404 consists only of a DC component. The cross mark 502 is set so that it is always located at substantially the center of the display screen 501.

Since the position of the analytical target area image 503 is recognized on a coordinate system of which the origin is the position at which the electron beam 406 passing through the center of deflection irradiates the surface of the sample 407 when the applied voltage (or applied current) to the XY-deflecting device 404 is zero, the frame of the analytical target area occupies a specific position on the image of the sample 407 even when the center of deflection of the electron beam 406 is moved.

Numeral 504 denotes an energy analysis area image and its position is recognized on a coordinate system of which the origin is the position at which the electron beam 406 passing through the center of deflection irradiates the surface of the sample 407 when the applied voltage (or applied current) to the XY-deflecting device 404 is zero. For this reason, it suffices to obtain the position of the energy analysis area once. A frame is provided for the range corresponding to the energy analysis area image or the range is made brighter or dimmer than its background so that it may be discriminated from the SEM image of the sample 407. Thereby, the position of the energy analysis area may be recognized by means of the computer 414.

Figure 4B:
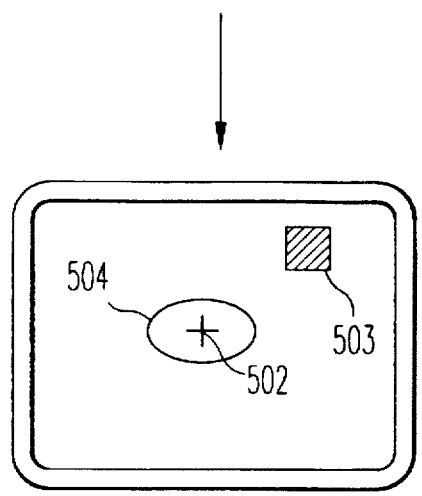

A description will now be given of the operation for matching the energy analysis area and the analyzing electron beam irradiation position using the apparatus of the present example. First, the center of deflection of the electron beam 406 is moved by issuing a command to the computer 414 from the input device 415 to control the deflecting power supply 405 so as to move the center of deflection of the electron beam 406. That is, it is moved so that the cross mark 502 comes to substantially the center of the energy analysis area image 504 as shown in FIG. 4(b). As a result, the analyzing electron beam irradiation position comes to substantially the center of the energy analysis area. In this state, value of the DC component of a voltage (or current) applied to the deflecting power supply 405 to move the center of deflection of the electron beam 406 or the command value corresponding thereto is stored to the storage unit 417. By determining the output value of the DC component of the deflecting power supply 405 based on the stored value, the electron beam apparatus may be maintained to its state of matching the analyzing electron beam irradiation position and the energy analysis area.

Figure 4C:
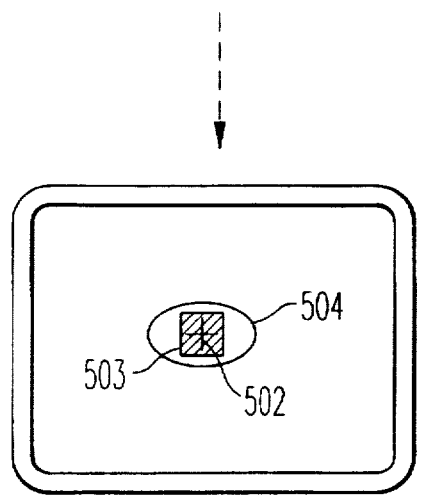
Figure 5:
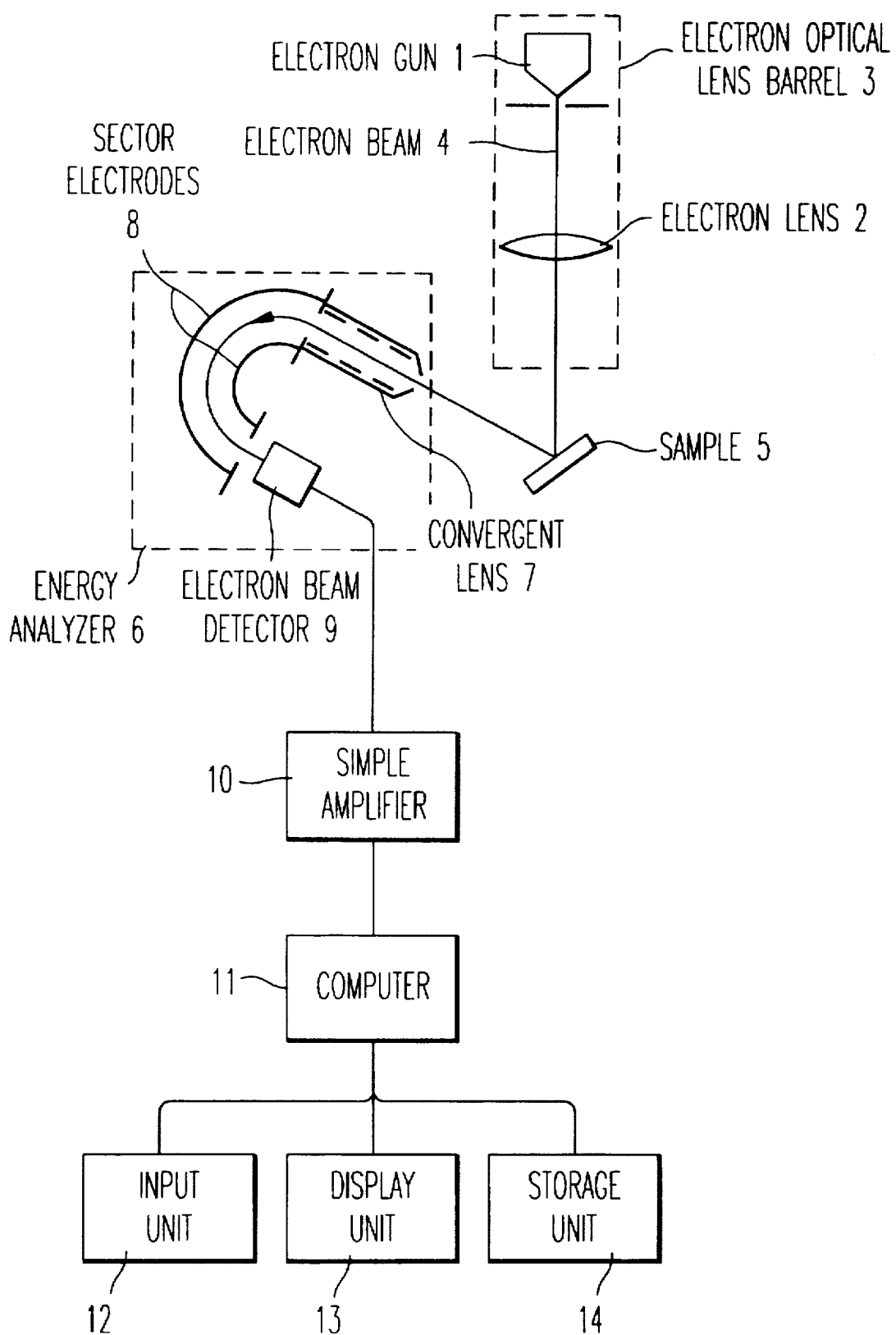
FIG. 5 schematically illustrates the construction of a conventional electron beam apparatus.

Next, the analytical target area is matched to the analyzing electron beam irradiation position (energy analysis area). To achieve this, in the present embodiment, the sample 407 is moved by means of the XY stage 418 while viewing the display screen 501 so that the cross mark 502 (energy analysis area image 504) comes to substantially the center portion of the analytical target area image 503. As a result, the three consisting of the analytical target area, analyzing electron beam irradiation position and energy analysis area are matched to each other and, as shown in FIG. 4(c), all of these three factors come to substantially the center of the display screen 501.

After the adjusting operation as described above, an analysis may be executed.

It should be noted that, while, in the above, the case has been described of matching the three factors, i.e., the analytical target area, the analyzing electron beam irradiation position and the energy analysis area, it is also possible to omit the operation for matching the analytical target area and the analyzing electron beam irradiation position (energy analysis area) if a fine adjustment of the sample position is not required because the analytical target area on the sample surface is relatively large. In such a case, designation of a analytical target area and its displaying on the screen may naturally be omitted. Further, in the operation for matching the energy analysis area and the analyzing electron beam irradiation position, since it is an operation to be performed prior to actual analysis, this operation may also be performed by using something other than the sample to be analyzed. In such a case, it is not required to designate an analytical target area.

Further, the present invention is not limited to the above described embodiment, and various modifications thereof are naturally possible without departing from its spirit.

For example, in the above embodiment, the DC component of voltage or current to be applied to the XY-deflecting device for controlling the electron beam irradiation position is applied to the XY-deflecting device through a computer in order to match the analyzing electron beam irradiation position and the energy analysis area, and the value of voltage or current for matching the analyzing electron beam irradiation position and the energy analysis area is stored to a storage unit. However, it is also possible by other means that: a generation circuit for a constant voltage or constant current having its main function of adjustment to match the analyzing electron beam irradiation position and the energy analysis area is provided separately at the deflecting power supply; the analyzing electron beam irradiation position is adjusted by using the separately provided deflecting power supply and the DC component of voltage or current to be applied to the XY-deflecting device is generated so that the analyzing electron beam irradiation position and the energy analysis area are matched to each other. In this case, the operation may be performed through the computer or the separately provided deflecting power supply may be independently operated. Further, it is also possible that: an input circuit is separately provided for a generation circuit at the deflecting power supply for a constant voltage or constant current of which the main function is an adjustment for matching the analyzing electron beam irradiation position and the energy analysis area; the analyzing electron beam irradiation position is adjusted by using the separately provided input circuit and a DC component of voltage or current to be applied to the XY-deflecting device is generated so that the analyzing electron beam irradiation position and the energy analysis area are matched to each other.

Further, the XY-deflecting device for controlling an electron-beam irradiation position is required to provide two functions, i.e., the electron beam scanning for obtaining an SEM image and the correcting of an electron beam irradiation position for matching the analyzing electron beam irradiation position and the energy analysis area. In the above embodiment of the present invention, these two functions are provided by a set of XY-deflecting device. As other means, it is also possible to provide a separate XY-deflecting device as that for correcting an electron beam irradiation position to match the analyzing electron beam irradiation position and the energy analysis area.

Further, while all of the SEM image, analytical target area image, displaying of the analyzing electron beam irradiation position and energy analysis area image are displayed on the screen of one display unit, a display unit may be separately provided for displaying the energy analysis area image and the analyzing electron beam irradiation position. In such a case, the energy analysis area image and the analyzing electron-beam irradiation position may be displayed at all times on the separately provided display unit.

Furthermore, one or more sets of XY-deflecting devices may be provided in the energy analyzer or between the energy analyzer and the sample (as illustrated by 421 in FIG. 3) to match the energy analysis area to the analyzing electron beam irradiation position.

Moreover, it is also possible that the energy analyzer or the electron-optical lens column is constructed as capable of being mechanically moved so that an adjustment for matching the analyzing electron beam irradiation position and the energy analysis area is performed by mechanically moving the energy analyzer (note, for example, element 421 of FIG. 3) or electron-optical lens column (see element 419 of FIG. 3) without performing moving of the analyzing electron beam irradiation position by an XY-deflecting device.

As has been described above, in accordance with the present invention, an electron beam apparatus may be adjusted while viewing an analytical target area, an analyzing electron beam irradiation position and an energy analysis area. An adjustment of the apparatus for matching the analyzing electron beam irradiation position and the energy analysis area and adjustment for matching an analytical target area, the analyzing electron beam irradiation position and the energy analysis area may be performed readily and with a high reproducibility. Further, an analytical target area on the surface of a sample may be accurately and easily matched to the energy analysis area (analyzing electron beam irradiation position).

What is claimed is:

1. A method for adjusting an electron beam apparatus including an electron-optical lens column, an energy analyzer, and a display, said method comprising the steps of:

providing a scanning electron beam from the electron-optical lens column for XY scanning of a surface of a sample to define by deflection of the electron beam a limited scanning electron microscope image area on the sample surface said image area further including at least a portion designated as an analytical target area;

using the energy analyzer to collect and analyze electron emissions from the surface of the sample being scanned to define an energy analysis area smaller than the scanning electron image area where emitted electrons are most efficiently collected by the energy analyzer;

using the display for displaying the scanning electron beam image area;

further using the display to display the energy analysis area by analyzing an output information obtained at the energy analyzer at the time of said electron beam scanning and creating an image of the energy analysis area superimposed on the scanning electron microscope image area;

further displaying as an image upon said scanning electron microscope image area of the display an analyzing electron beam irradiation position indicator indicating a point on the surface of the sample being irradiated by the electron beam emitted from the electron-optical lens column at a time corresponding to a non-scanning state of the electron beam; and adjusting a trajectory of the electron beam irradiated onto the surface of the sample from the electron-optical lens so as to overlap the energy analysis area image and the analyzing electron beam irradiation position indicator on the scanning electron microscope image area of the display.

2. A method for adjusting an electron beam apparatus according to claim 1, wherein the step of adjusting the trajectory of the electron beam is performed by deflecting the electron beam emitted from the electron-optical lens column.

3. A method for adjusting an electron beam apparatus according to claim 2, further comprising the steps of:

displaying the analytical target area as an analytical target area image on the scanning electron microscope image area of the display; and adjusting the sample position to match the analytical target area image and the energy analysis area image in an overlapped condition on the display and/or to match the analytical target area image to the analyzing electron-beam irradiation position indicator in an overlapped condition on the display.

4. A method for adjusting an electron beam apparatus according to claim 1, further comprising the steps of:

displaying the analytical target area as an analytical target area image on the scanning electron microscope image area of the display; and adjusting the sample position to match the analytical target area image and the energy analysis area image in an overlapped condition of the display and/or to match the analytical target area image to the analyzing electron-beam irradiation position indicator in an overlapped condition of the display.

5. An electron beam apparatus comprising:

an electron-optical lens column having an electron gun, an electron lens or electron lenses and an XY-deflecting device provided to deflect an electron beam in an XY direction to scan the electron beam within a predetermined scan range relative to a surface of a sample being irradiated by the electron beam;

an energy analyzer positioned for collecting electrons emitted from the surface of the sample irradiated by the electron beam;

an image display unit for displaying a scanning electron microscope image of a predetermined area on the surface of the sample obtained by a scanning of the electron beam using the XY-deflection device;

a first image processing means receiving an output from the energy analyzer during electron beam scanning for computing and displaying in a superimposed manner upon said scanning electron microscope image an energy analysis area representing the scanned surface area of the sample emitting electrons collected by the energy analyzer with a high efficiency;

a second image processing means for displaying upon said scanning electron microscope image an analyzing electron beam irradiation position indicator indicating a point on the surface of the sample in the predetermined area irradiated by the electron beam from the electron-optical lens column at a time corresponding to a non-scanning state of the electron beam; and a position adjustment means for changing a relative position between the displayed energy analysis area and the displayed analyzing electron beam irradiation position indicator, said position adjustment means providing the change in relative position by modifying deflection of the electron beam by said deflection device.

6. An electron beam apparatus comprising:

an electron-optical lens column having an electron gun, an electron lens or electron lenses and an XY-deflection device provided to deflect an electron beam in an XY direction to scan the electron beam within a predetermined scan range relative to a surface on a sample being irradiated by the electron beam;

an energy analyzer positioned for collecting electrons emitted from the surface of the sample irradiated by the electron beam;

an image display unit for displaying a scanning electron microscope image of a predetermined area on the surface of the sample obtained by a scanning of the electron beam using the XY-deflecting device;

a first image processing means receiving an output from the energy analyzer during electron beam scanning for computing and displaying in a superimposed manner upon said scanning electron microscope image an energy analysis area representing the scanned surface area of the sample emitting electrons collected by the energy analyzer with a high efficiency;

a second image processing means for displaying upon said scanning electron microscope image an analyzing electron beam irradiation position indicator indicating a point on the surface of the sample in the predetermined area irradiated by the electron beam from the electron-optical lens column at a time corresponding to a non-scanning state of the electron beam; and a position adjustment means including one or more sets of XY-deflecting devices existing between the sample and the energy analyzer, said position adjustment means being operated to change deflection by the one or more sets of XY deflecting devices to overlap at least the energy analysis area image and the analyzing electron beam irradiation position indicator image.

7. An electron beam apparatus comprising:

an electron-optical lens column having an electron gun, an electron lens and an XY-deflecting device provided to deflect an electron beam in an XY direction to scan the electron beam within a predetermined scan range relative to a surface on a sample being irradiated by the electron beam;

an energy analyzer positioned for collecting electrons emitted from the surface of the sample irradiated by the electron beam;

an image display unit for displaying a scanning electron microscope image of a predetermined area on the surface of the sample obtained by a scanning of the electron beam using the XY-deflection device;

a first image processing means receiving an output from the energy analyzer during electron beam scanning for computing and displaying in a superimposed manner upon said scanning electron microscope image an energy analysis area representing the scanned surface of the sample emitting electrons collected by the energy analyzer with a high efficiency;

a second image processing means for displaying upon said scanning electron microscope image an analyzing electron beam irradiation position indicator indicating a point on the surface of the sample in the predetermined area irradiated by the electron beam from the electron-optical lens column at a time corresponding to a non-scanning state of the electron beam; and a position adjustment means for mechanically moving the electron-optical lens column and/or the energy analyzer.

* * * * *